United States Patent [19]

Baglee

[11] Patent Number: 4,891,747
[45] Date of Patent: Jan. 2, 1990

[54] LIGHTLY-DOPED DRAIN TRANSISTOR STRUCTURE IN CONTACTLESS DRAM CELL WITH BURIED SOURCE/DRAIN

[75] Inventor: David A. Baglee, Houston, Tex.

[73] Assignee: Texas Instruments Incorporated, Dallas, Tex.

[21] Appl. No.: 900,223

[22] Filed: Aug. 22, 1986

Related U.S. Application Data

[63] Continuation of Ser. No. 624,082, Jun. 25, 1984, abandoned.

[51] Int. Cl.$^4$ ............................................. H01L 29/78
[52] U.S. Cl. ..................................... 357/23.6; 357/59; 357/45; 357/90; 357/53
[58] Field of Search .................... 357/54, 45, 23.6, 59, 357/90, 23.5, 53, 59 G, 54 M

[56] References Cited

U.S. PATENT DOCUMENTS

| | | | |
|---|---|---|---|
| 3,811,076 | 5/1974 | Smith, Jr. | 357/23.6 X |
| 3,893,146 | 7/1975 | Heeren | 357/23.6 |
| 4,290,186 | 9/1981 | Klein et al. | 357/23.6 X |
| 4,455,566 | 6/1984 | Sakurai | 357/23.6 X |
| 4,489,338 | 12/1984 | Voncken | 357/23.6 |
| 4,597,000 | 6/1986 | Adam | 357/54 X |
| 4,622,570 | 11/1986 | Taguchi | 357/23.6 |

FOREIGN PATENT DOCUMENTS

| | | | |
|---|---|---|---|
| 52-2180 | 1/1977 | Japan | 357/23.6 |
| 52-71139 | 6/1977 | Japan | 357/54 M |
| 54-22785 | 2/1979 | Japan | 357/23.6 |
| 0138381 | 10/1979 | Japan | 357/23.6 |
| 0065455 | 5/1980 | Japan | 357/23.6 |
| 55-71059 | 5/1980 | Japan | 357/23.6 |
| 0007877 | 1/1983 | Japan | 357/23.6 |
| 59-130461 | 7/1984 | Japan | 357/23.6 |

OTHER PUBLICATIONS

Walker, "Process for Making a Push Plate RAM Cell," *IBM Technical Disclosure Bulletin*, vol. 26, No. 10A, Mar. 1984, pp. 4931-4933.
Sodini et al., "Enhanced Capacitor for One-Transistor Memory Cell," *IEEE Transactions on Electron Devices*, Oct. 1976, pp. 1187-1189.

*Primary Examiner*—William Mintel
*Attorney, Agent, or Firm*—Theodore D. Lindgren; Thomas W. DeMond; Melvin Sharp

[57] ABSTRACT

A dynamic RAM cell of the contactless type with a buried N+ source/drain region is constructed by the metal-gate non-self-aligned technique. A lightly-doped drain is provided by employing both arsenic and phosphorus in the buried N+ region. The effects of impact ionization are thus minimized, and a high density cell array is provided.

3 Claims, 2 Drawing Sheets

LIGHTLY-DOPED DRAIN TRANSISTOR STRUCTURE IN CONTACTLESS DRAM CELL WITH BURIED SOURCE/DRAIN

This is a continuation of application Ser. No. 624,082, filed Jun. 25, 1984, now abandoned.

BACKGROUND OF THE INVENTION

This invention relates to the manufacture of VLSI semiconductor devices, and more particularly to a method of making metal-gate MOS transistors for dynamic memory cells in which lightly-doped drains are provided.

As set forth in the copending patent applications Ser. Nos. 418,897, filed Sept. 16, 1982, now abandoned, by James M. McDavid and 412,753, filed Aug. 30, 1982 by Michael Smayling and Michael Duane, now U.S. Pat. No. 4,566,175, issued Jan. 28, 1986, it is advantageous to provide a lightly-doped drain (LDD) structure for MOS transistors in high density dynamic memory cells, for example. The processes previously used to provide the LDD structure made use of sidewall spacers. However, in a contactless metal-gate cell structure which does not use self-aligned gates, it is not possible to employ the sidewall space technique.

It is the principal object of this invention to provide an improved MOS transistor structure, particularly using the lightly-doped drain technique. Another object is to provide a LDD structure in a contactless, non-self-aligned, buried bit line, dynamic RAM cell layout.

SUMMARY OF THE INVENTION

In accordance with one embodiment of the invention a dynamic RAM cell of the contactless type with a buried N+ source/drain region is constructed by the metal-gate non-self-aligned technique. A lighly-doped drain is provided by employing both arsenic and phosporus in the buried N+ region. The effects of impact ionization are thus minimized, and a high density cell array is provided.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
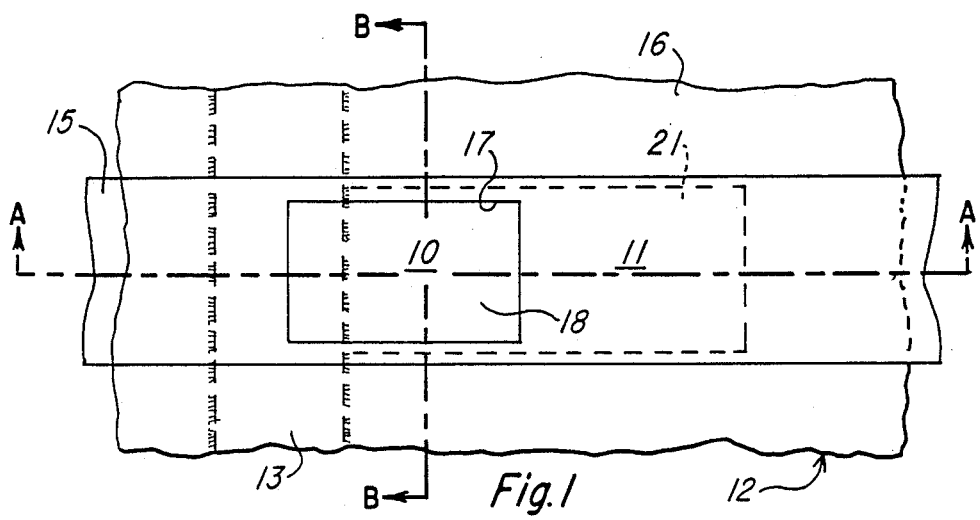
FIG. 1 is a plan view, greatly enlarged, of a small part of a silicon bar showing one memory according to the invention.
Figure 2A:
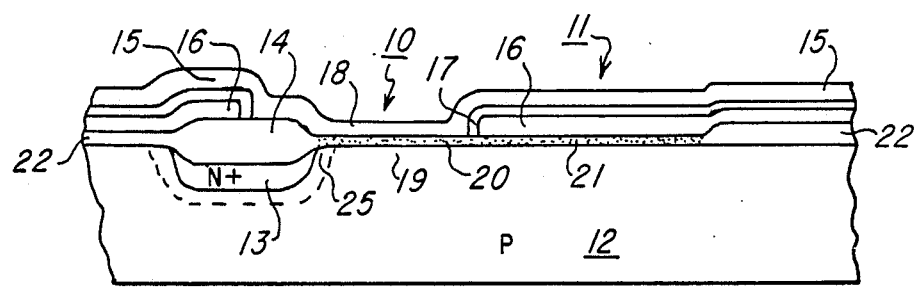
FIGS. 2a and 2b are elevation views in section of the memory cell of FIG. 1, taken along the lines a—a and b—b, respectively, in FIG. 1.

Referring to FIGS. 1, 2a, 2b and 3, a memory cell constructed according to the invention includes an access transistor 10 and a storage capacitor 11 formed in a silicon substrate 12. An N+ bit line 13 is buried under thick thermal oxide 14. A word line 15, in this case molybdemun, extends along the face of the substrate 12 perpendicular to the bit line 13. The word line 15 also could be titanium silicide, for example. The capacitor 11 is created by a grounded field plate 16 composed of first level polysilicon. A hole 17 in the field plate defines the area of the gate 18 of the access transistor 10. This gate is separated from the channel 19 of the transistor by thin gate oxide 20 of perhaps 100 to 200 Å thickness. The capacitor dielectric 21 is a thin thermal oxide formed separate from the gate oxide 20. A thicker insulator 22 underlies parts of the field plate 16 other than the area of the capacitor 11; this insulator 22 may include both thermal oxide and silicon nitride, or may be only oxide.

According to the invention, a lightly-doped drain structure is provided by a phosphorus-doped region 25 which diffused ahead of the arsenic-doped bit line 13, due to the high diffusion coefficient of phosphorus. This produces a graded junction for the purpose of reducing the effects of impact ionization.

Figures 2B, 3:
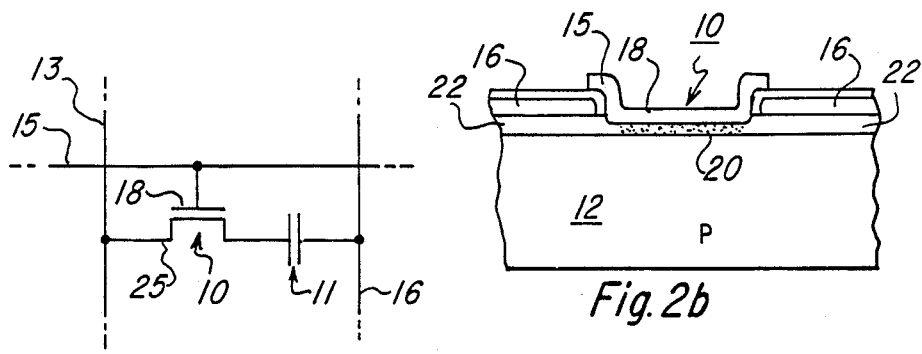
FIG. 3 is an electrical schematic diagram of the memory cell of FIGS. 1, 2a and 2b.
Figure 4:
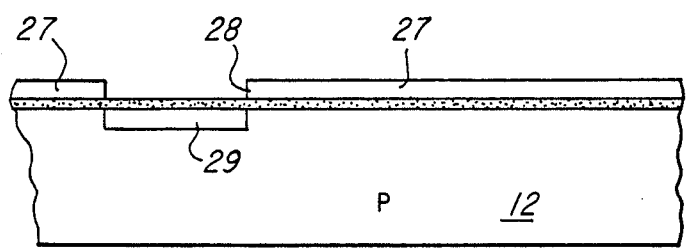
FIGS. 4 and 5 are elevation views in section of the device of FIGS. 1, 2a and 2b at successive stages in the manufacture thereof.
Figure 5:
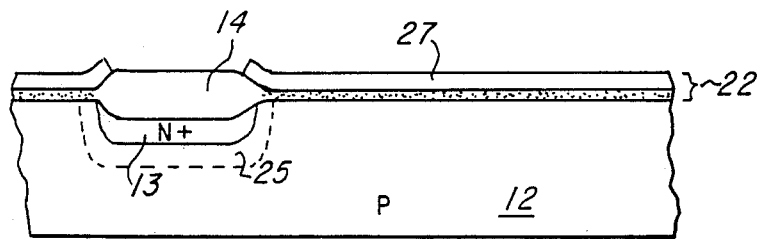

In a method of making the structure of FIGS. 1–3, a nitride mask 27 is formed on a silicon substrate 10 as seen in FIG. 4, and both arsenic and phosphorus are implanted in the aperature 28 where the bit line 13 is to be formed, leaving a shallow N+ region 29. The slice is next subjected to a thermal oxidation step, at perhaps 950° C. in oxygen or steam for one hour, for example, to produce the thick oxide 14 over the bit line 13. The arsenic and phosphorus segregate out ahead of the oxidation front, leaving the N+ bit line due to arsenic, but the phosphorus diffuses much faster to create the region 25 as seen in FIG. 5. The nitride 27 is removed from the capacitor region and the proper thresholds are set by implantation; it is left in place over the face to create the insulator 22. The thin oxide 21 is then grown in the capacita area 11 and the polysilicon layer 16 is deposited. The aperature 17 is formed by a photolithgraphic step, and the interlevel oxide 28 is grown over the poly; also at this point the gate oxide 20 is grown. The word line 15 is then created by depositing a layer of molybdenum and patterning.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A field-effect transistor comprising:
    a silicon body having a drain region in a face thereof, the drain region having a heavily-doped region doped with impurity of one conductivity type, the drain region being adjacent a channel area of said face,
    a thick thermal oxide layer over said drain region, and said drain region containing arsenic as a slow-diffusing impurity of said one type to form a lightly-doped region diffused ahead of said heavily-doped region toward said channel area to produce a lightly-doped-drain transistor,
    a field plate in the form of a conductor layer over said face, insulated from said drain region by said thick oxide, and insulated from the remainder of said face by a thin oxide layer much thinner than said thick thermal oxide layer, a hole in said plate over said channel area adjacent said drain region, said hole also overlapping said thick oxide layer, and a conductive strip extending along said face over said field plate but insulated therefrom, said conductive strip also extending into said hole to provide the gate of a transistor.

2. A device according to claim 1 wherein a capacitor region doped with impurity of said one type to provide a low threshold voltage is defined in said face beneath said field plate adjacent said channel region to provide a one-transistor, one capacitor dynamic memory cell.

3. A device according to claim 2 wherein said conductive strip is a word line and said drain region is part of a bit line for an array of said dynamic memory cells.

* * * * *